(12) United States Patent
Penttonen et al.

(10) Patent No.: US 12,174,223 B2
(45) Date of Patent: Dec. 24, 2024

(54) APPARATUS AND TOOL FOR A MEASUREMENT COIL

(71) Applicant: Safegrid Oy, Espoo (FI)

(72) Inventors: Jyrki Penttonen, Helsinki (FI); Jussi Hakunti, Turku (FI)

(73) Assignee: Safegrid Oy, Espoo (FI)

( * ) Notice: Subject to any disclaimer, the term of this patent is extended or adjusted under 35 U.S.C. 154(b) by 218 days.

(21) Appl. No.: 17/926,366

(22) PCT Filed: Jul. 16, 2021

(86) PCT No.: PCT/FI2021/050535
§ 371 (c)(1),
(2) Date: Nov. 18, 2022

(87) PCT Pub. No.: WO2022/018326
PCT Pub. Date: Jan. 27, 2022

(65) Prior Publication Data
US 2023/0213558 A1  Jul. 6, 2023

(30) Foreign Application Priority Data
Jul. 21, 2020 (FI) .................................... 20205764

(51) Int. Cl.
*G01R 15/18* (2006.01)
*G01R 19/00* (2006.01)
(Continued)

(52) U.S. Cl.
CPC ....... *G01R 15/181* (2013.01); *G01R 19/0092* (2013.01); *H01F 27/06* (2013.01); *H01F 38/30* (2013.01); *H01F 2027/065* (2013.01)

(58) Field of Classification Search
CPC .... G01R 15/181; G01R 19/0092; G01R 1/04; G01R 15/18; H01F 27/06; H01F 38/30; H01F 2027/065
(Continued)

(56) References Cited

U.S. PATENT DOCUMENTS 5,057,769 A    10/1991  Edwards
2008/0129314 A1*  6/2008  Ricci .................... G01R 15/186
                                                        324/555

(Continued)

FOREIGN PATENT DOCUMENTS

CN    105588976 A    5/2016
CN    105510668 B    8/2018
(Continued)

OTHER PUBLICATIONS

Finnish Patent and Registration Office, Search Report, Application No. 20205764,, Mailed Feb. 18, 2021, 2 pages.
(Continued)

*Primary Examiner* — Tung X Nguyen
*Assistant Examiner* — Robert P Alejnikov, Jr.
(74) *Attorney, Agent, or Firm* — Ziegler IP Law Group LLC.

(57) ABSTRACT

An apparatus and a tool for installation of a measurement coil. The apparatus includes a tool and a holder. The tool includes a first portion and a second portion at least partially surrounding the first portion. The first portion is configured to receive a conductor and the second portion is configured to hold a measurement coil. The holder is configured to be detachably attached to the tool, wherein the holder is to be employed to install the tool holding the measurement coil onto a conductor. The first portion is configured to snap fit onto the conductor during installation, and the measurement coil at least partially surrounds the conductor when installed.

24 Claims, 9 Drawing Sheets

(51) Int. Cl.
*H01F 27/06* (2006.01)
*H01F 38/30* (2006.01)

(58) Field of Classification Search
USPC .................. 324/117 R, 117 H, 126, 127
See application file for complete search history.

(56) References Cited

U.S. PATENT DOCUMENTS

| | | |
|---|---|---|
| 2009/0187285 A1 | 7/2009 | Yaney et al. |
| 2011/0148561 A1 | 6/2011 | Lint et al. |
| 2012/0256617 A1 | 10/2012 | Moreux et al. |
| 2013/0187636 A1 | 7/2013 | Kast et al. |
| 2016/0041204 A1* | 2/2016 | Bietz .................. G01R 19/0092 324/127 |
| 2017/0006667 A1 | 1/2017 | Falcon et al. |
| 2017/0363661 A1* | 12/2017 | Rodriguez, Jr .... G01R 19/0092 |
| 2020/0018787 A1 | 1/2020 | Lindsey et al. |
| 2022/0113337 A1* | 4/2022 | Ribeiro ................ G01R 15/181 |
| 2023/0069419 A1* | 3/2023 | Steuer ...................... G01R 1/22 |
| 2023/0402825 A1* | 12/2023 | Nunez ...................... F16L 3/06 |

FOREIGN PATENT DOCUMENTS

| | | | | |
|---|---|---|---|---|
| CN | 109613317 A | | 4/2019 | |
| CN | 109813941 A | | 5/2019 | |
| DE | 102015115264 B3 | * | 8/2016 | .............. G01R 1/04 |
| DE | 102017120909 A1 | | 3/2019 | |
| EP | 125050 A | * | 11/1984 | ............ G01K 1/024 |
| EP | 0218225 A2 | | 4/1987 | |
| EP | 2810088 A1 | | 12/2014 | |
| EP | 2985613 A1 | | 2/2016 | |
| EP | 2914968 A4 | | 7/2016 | |
| IN | 203232064 U | | 10/2013 | |

OTHER PUBLICATIONS

Notification of Transmittal of The International Preliminary Report on Patentability, Application No. PCT/FI2021/050535, Mailed Jul. 12, 2022, 20 pages.

Notification of Transmittal of The International Search Report and the Written Opinion of The International Searching Authority, or the Declaration, Application No. PCT/FI2021/050535, Mailed Oct. 21, 2021, 17 pages.

* cited by examiner

APPARATUS AND TOOL FOR A MEASUREMENT COIL

TECHNICAL FIELD

The present disclosure relates generally to installation of current measurement devices; and more specifically, to apparatuses for installation of measurement coils in proximity of conductors. The present disclosure also relates to tools for holding measurement coils in proximity of conductors.

BACKGROUND

With increasing dependence on electrical systems, regular monitoring of operating parameters, such as current and voltage, is crucial to ensure proper functioning and integrity of such systems. Notably, values of such operating parameters are determined using measurement coils installed in the electrical systems. In particular, such measurement coils are installed proximate to electrical wires in electrical systems. For example, a measurement coil implemented as a Rogowski coil is installed encircling a current-carrying electrical wire whose current is to be measured.

Notably, measurement coils when installed in electrical systems require specific installation to ensure proper functioning thereof. For example, Rogowski coils require a stabilized and a substantially centralized positioning around the electrical wire. Such specific installation requirements are highly time-consuming and labour intensive. Furthermore, skilled technicians are required to ensure that installation is performed in a manner that the measurement coil provides accurate and precise outputs. Moreover, power supply to the electrical systems has to be turned off to ensure a safe installation of the measurement coil.

Typically, measurement coils are installed proximate to electrical wires using makeshift arrangements. Such makeshift arrangements may include attachment means such as zip ties, tie wires, hooks, adhesive pads, adhesive tapes, and so on. However, such makeshift arrangements do not provide stability to the measurement coil. Therefore, it presents a significant safety risk as the measurement coil is susceptible to contact with the electrical wire. Furthermore, a significant effort is required to substantially centre the measurement coils with respect to the electrical wires. Moreover, conventional measurement coils have standardized sizes and can be installed readily onto distantly placed electrical wires. However, when such measurement coils are to be installed in congested spaces, such as in small electrical enclosures, the measurement coils are installed overlapping each other. Such overlap results in voltage interference in a measurement coil from nearby measurement coils or nearby electrical wires.

Therefore, in light of the foregoing discussion, there exists a need to overcome the aforementioned drawbacks associated with the conventional methods of installation of measurement coils.

SUMMARY

The present disclosure seeks to provide an apparatus for installation of measurement coils in proximity of conductors. The present disclosure also seeks to provide a tool for holding a measurement coil in proximity of conductors. The present disclosure seeks to provide a solution to the existing problem of time-consuming and labour-intensive process of installation of measurement coils proximate to conductors that are susceptible to variations in position and orientation. An aim of the present disclosure is to provide a solution that overcomes at least partially the problems encountered in prior art, and provides an apparatus that enables straightforward, safe and time-efficient installation ensuring stability and precise positioning of the measurement coils around conductors.

In one aspect, an embodiment of the present disclosure provides an apparatus comprising:
- a tool comprising a first portion and a second portion at least partially surrounding the first portion, wherein the first portion is configured to receive a conductor and the second portion is configured to hold a measurement coil; and
- a holder configured to be detachably attached to the tool, wherein the holder is to be employed to install the tool holding the measurement coil onto a conductor,
- wherein the first portion is configured to snap fit onto the conductor during installation, and the measurement coil at least partially surrounds the conductor when installed.

In another aspect, an embodiment of the present disclosure provides a tool comprising a first portion and a second portion at least partially surrounding the first portion, wherein the first portion is configured to receive a conductor and the second portion is configured to hold a measurement coil, wherein the first portion is configured to snap fit onto a conductor during installation of the tool holding the measurement coil, and the measurement coil at least partially surrounds the conductor when installed.

Embodiments of the present disclosure substantially eliminate or at least partially address the aforementioned problems in the prior art and enable precise installation of measurement coils around conductors thereby enhancing measurement accuracy of the measurement coils.

Additional aspects, advantages, features, and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

Figure 1A:
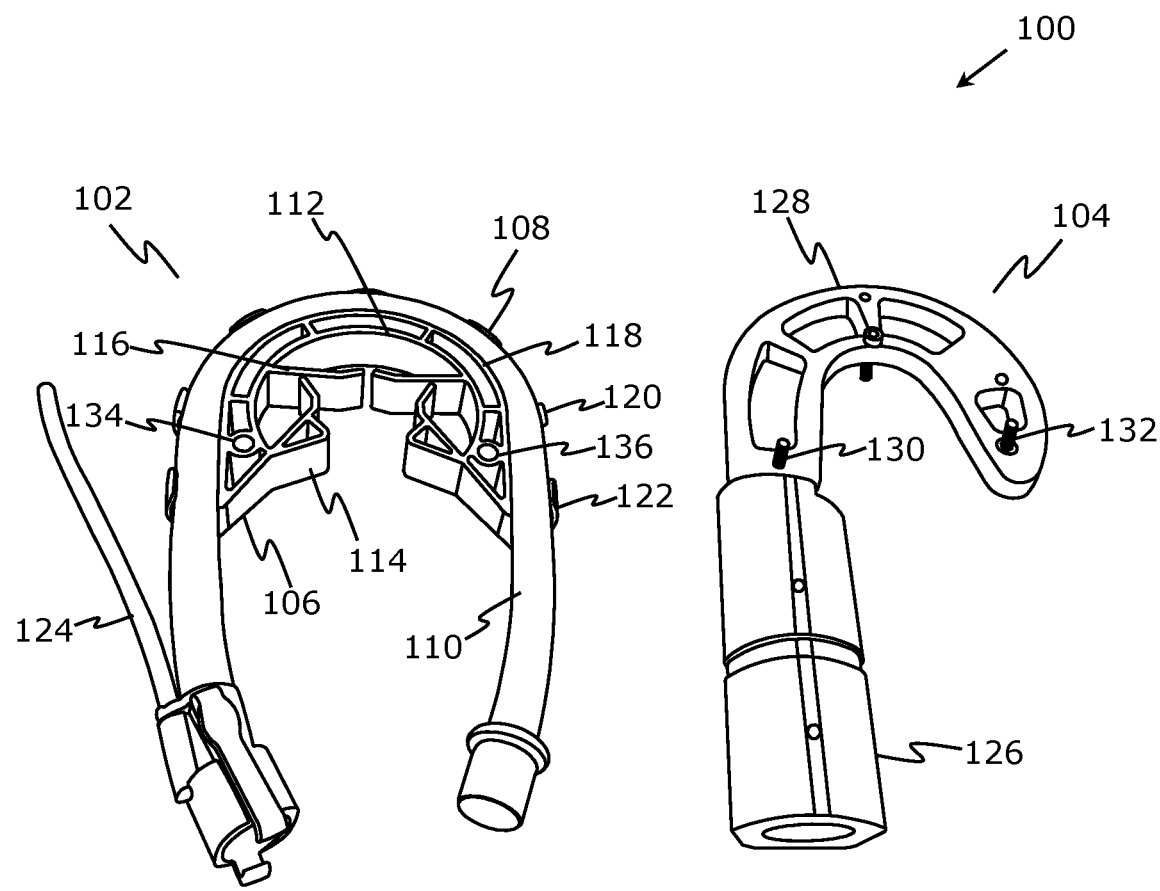
FIG. 1A is a perspective view of an apparatus, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides an apparatus comprising:
- a tool comprising a first portion and a second portion at least partially surrounding the first portion, wherein the first portion is configured to receive a conductor and the second portion is configured to hold a measurement coil; and
- a holder configured to be detachably attached to the tool, wherein the holder is to be employed to install the tool holding the measurement coil onto a conductor,
- wherein the first portion is configured to snap fit onto the conductor during installation, and the measurement coil at least partially surrounds the conductor when installed.

In another aspect, an embodiment of the present disclosure provides a tool comprising a first portion and a second portion at least partially surrounding the first portion, wherein the first portion is configured to receive a conductor and the second portion is configured to hold a measurement coil, wherein the first portion is configured to snap fit onto a conductor during installation of the tool holding the measurement coil, and the measurement coil at least partially surrounds the conductor when installed.

Pursuant to embodiment of the present disclosure, the apparatus and the tool described herein enable secure and stabilised installation of the measurement coil proximate to the conductor. The apparatus of the present disclosure comprises a tool that serves as a guiding element for installing the measurement coil in proximity of the conductor. The apparatus enables easy and straightforward installation of the measurement coil around the current carrying conductor at the desired position. Moreover, performing the installation does not require a shutdown of electrical supply to the conductor, even in high voltage electrical environments. Furthermore, the apparatus significantly reduces effort required to install measurement coils around closely spaced conductors or in congested electrical enclosures. Notably, the tool of the present disclosure provides a support structure to the measurement coil that ensures stabilised orientation and positioning thereof. Beneficially, such stability in positioning significantly increases measurement accuracy and precision of the measurement coil. Furthermore, the support structure provided by the tool ensures that the measurement coil maintains position and orientation thereof over extended periods of time.

Throughout the present disclosure, the term "measurement coil" refers to an electrical sensor configured to measure operating parameters of electrical systems, specifically conductors, when positioned proximate to such conductors. Typically, measurement coils are flexible that, when installed, at least partially surround the conductor. In an example, the measurement coil measures an alternating current passing through the conductor. In an example, the measurement coil is implemented as a toroid, that is uniformly wound on a non-magnetic core of constant cross-sectional area. The output of the measurement coil is usually connected to an external circuit to provide an output signal that is proportional to the operating parameter that the measurement coil is configured to measure. Optionally, a single-chip signal processor with built-in analogue to digital converters may be used to provide an output signal that is proportional to the operating parameter. Notably, measurement coils are required to be installed in a specific manner to achieve an accurate operation thereof. For example, the measurement coil may require a centralised positioning of the conductor between the coil. Furthermore, operation of the measurement coils is optimised when there is minimal variation in position thereof, after installation. Therefore, the tool enables a simplified installation of the measurement coil in the required manner to ensure efficient operation thereof.

The apparatus comprises a tool comprising a first portion and a second portion at least partially surrounding the first portion, wherein the second portion is configured to hold a measurement coil. The tool functions as a framework for the measurement coil that is arranged around the conductor. In such framework, the first portion of the tool forms an inner part (namely, a core), and the second portion forms an outer part of the tool that at least partially surrounds the first portion. The tool comprises an arrangement of different parts for providing a support structure to the measurement coil and to securely hold the measurement coil. Specifically, the first portion of the tool provides the support structure to the measurement coil and the second portion securely holds the measurement coil. Notably, the second portion of the tool is configured on periphery of the first portion and may be implemented using hooks, clips, grooves, curved receptacles and the like, to securely hold the measurement coil. In an example, the tool is fabricated from non-conductive and non-magnetic material such as a polymer (such as polyethylene, high density polyethylene, ultra-high molecular weight polyethylene, polypropylene, nylon, polytetrafluoroethylene, polyester, polyethyl ether ketone, and so on), a ceramic, a glass, a fibre, or any combination thereof. Beneficially, the tool ensures that the measurement coil is held securely around a vertically or horizontally arranged conductor, thereby ensuring precise and accurate outputs from the measurement coil. In some implementations, the second portion partially surrounds the first portion, whereas in other implementations, the second portion fully surrounds the first portion. Optionally, a part of the first portion surrounded by the second portion lies in a range of 60% to 100% of a total periphery of the first portion of the tool.

Optionally, the measurement coil is bent into a curved shape when held by the second portion of the tool. As mentioned previously, the second portion of the tool is configured on periphery of the first portion. Therefore, the measurement coil assumes a shape of the periphery of the first portion. Notably, the second portion of the tool curves around the periphery of the first portion, thereby bending the measurement coil into the curved shape.

In an embodiment, the curved shape is circular. Herein, the second portion of the tool fully surrounds the first portion. Therefore, upon installation of the tool onto the conductor, the second portion, and thereby the measurement coil, may fully surround (namely, encircle) the conductor. The term "circular" as used herein intends to indicate a shape of the measurement coil that is a closed loop that does not have any distinctive end points. Alternative wording for circular is "O-shaped" form.

In another embodiment, the curved shape is U-shaped. Herein, the second portion of the tool partially surrounds the first portion. Therefore, the measurement coil, when installed may only partially surround (namely, encircle) the conductor. Beneficially, the measurement coil when bent into a U-shape has a smaller circumference and therefore is ideal for installation around closely placed conductors. Notably, the U-shaped measurement coil, when installed using the tool, provides measurement accuracy similar to the circular-shaped measurement coil.

Optionally, the measurement coil is implemented on a printed circuit board, wherein the printed circuit board has a form factor of a curved shape arranged to be held by the second portion of the tool. Notably, the printed circuit board typically mechanically supports and electrically connects the electrical or electronic components using conductive elements, such as wires, pads, tracks, pathways and so forth. In an example, the curved form factor of the printed circuit board is implemented using flexible plastic substrates, such as polyimides, Polyether Ether Ketones (PEEK) or transparent conductive polyester films. Such flexible plastic substrates allow bending of the measurement coil into the curved shape to be held by the second portion of the tool.

Throughout the present disclosure, the term "conductor" refers to an electrical conducting element that allows flow of electric charge therethrough. Notably, the conductor is fabricated using metals, such as copper, iron, gold, silver, aluminium, or alloys thereof. The conductor further comprises an electrical insulation coating on outer surface thereof. In an instance, the conductor is a uniformly straight conductor, for example in the form of wires. In an example, the conductor may be an overhead transmission wire, an underground transmission wire, an electrical wire housed in electrical enclosure, and the like.

The apparatus comprises a holder configured to be detachably attached to the tool, wherein the holder is to be employed to install the tool holding the measurement coil onto a conductor. The holder is a guiding element that assists in installing the tool holding the measurement coil onto the conductor. The holder is detached from the tool once the tool has been securely installed onto the conductor. Notably, at least a part of the holder is designed to be structurally complementary to the tool. Such complementary structure of the tool and the holder provides stability and protection to the tool and measurement coil held thereby, during the installation process. Furthermore, the holder is designed in a manner that any physical contact between the conductor and the user installing the tool onto said conductor is entirely eliminated. Moreover, the holder and the tool comprise complementary parts that are engaged with each other prior to installation of the tool holding the measurement coil. Notably, once the tool has been installed onto the conductor, the holder is detached from the tool by disengaging the complementary engaging parts. Optionally, slight mechanical pressure may be applied to disengage the complementary engaging parts. Optionally, the holder may be implemented in shapes, such as a hook-shape, a sickle-shape, a square-shape, a U-shape, and so forth.

Moreover, the first portion is configured to snap fit onto the conductor during installation, and the measurement coil at least partially surrounds the conductor when installed. Notably, the tool does not require customised modifications based on the conductor onto which the tool is to be installed. Specifically, the first portion of the tool comprises flexible elements that allow installation of the tool onto conductors of varying thicknesses. The first portion of the tool flexes in a manner that the conductor fits snugly inside the tool. It will be appreciated that upon application of a force from the user installing the tool onto said conductor, the first portion of the tool flexes and changes its configuration to accommodate the conductor in a central section thereof. Such snap fit of the tool onto the conductor ensures that no additional means of attachment is required to secure the tool around the conductor. As mentioned previously, the second portion that at least partially surrounds the first portion is configured to hold the measurement coil. Therefore, installing the tool onto the conductor using the first portion of the tool results in the measurement coil at least partially surrounding the conductor after installation. In some implementations, the measurement coil partially surrounds the conductor, whereas in other implementations, the measurement coil fully encircles the conductor. Optionally, a portion of the conductor surrounded by the measurement coil lies in a range of 60% to 100% of a total periphery of the conductor.

Optionally, the conductor is located in a proximity of a centre of the curved shape, and the conductor is perpendicular to a plane of the curved shape. Notably, the measurement coil is bent into the curved shape when held by the second portion of the tool. Herein, the conductor is located in proximity of the centre of curved shape of the measurement coil, when installed. Such central location of the conductor with respect to the measurement coil significantly improves measurement accuracy thereof. It will be appreciated that the first portion of the tool is implemented in a manner that during installation, the conductor is located in proximity of centre without requiring substantial effort from the user performing the installation. Furthermore, the conductor is perpendicular to a plane of the curved shape. In other words, the plane of the curved space is arranged orthogonally with respect to the conductor. Beneficially, the apparatus and tool described in the present disclosure provide a solution to the problem of uncentered, lopsided and asymmetrical installation of measurement coils around conductors. The snap fit between the first portion of the tool and the conductor ensures a stabilised, centred installation of the measurement coil.

In an embodiment, the first portion comprises an open-curved wall and a plurality of elements extending inwards from the open-curved wall. In particular, the open-curved wall refers to a curved structure comprising different beginning and end points. In other words, the open-curved wall is a U-shaped element. The plurality of elements extends inwards towards the centre of the curved shape formed by the open-curved wall. Notably, the plurality of elements extend inwards in a manner that it forms a space proximate to the centre of the first portion. During installation of the measurement coil, the plurality of elements accommodate the conductor in such space thereby enabling the snap fit arrangement of the tool around the conductor.

Optionally, at least one of the plurality of elements extends outwards and is connected to the second portion of the tool. In particular, at least one of the plurality of elements extends outwards from the open-curved wall and connects the second portion of the tool to the open-curved wall. Beneficially, such connection provides stability and support to the open curved wall. Furthermore, at least one of the plurality of elements extending outwards provides structural support for holding the conductor firmly in the tool.

In an embodiment, the second portion comprises a base, an inner wall and an outer wall, the outer wall comprising fingers extending laterally from the base. Herein, the base of the second portion extends outwards from the inner wall, wherein the base is perpendicular to the inner wall. Furthermore, the outer wall comprising fingers extending laterally from the base, is parallel to the inner wall. The fingers are configured at regular intervals along the base. Such configuration of the base, the inner wall and the outer wall creates a space therebetween wherein the measurement coil is arranged. Notably, the length of the base between the inner wall and the outer wall is configured in a manner that the measurement coil snap fits in the recess created therebetween. Optionally, the fingers are fabricated using flexible materials and flex to ensure a snug fit of the measurement coil in the second portion. Alternatively, optionally, the fingers are implemented using mechanical fixing elements such as bolts, belt fasteners and the like, that fasten the measurement coil in the second portion of the tool. Beneficially, the fingers create spacing in the outer wall allowing the measurement coil to release any heat during operation thereof.

Optionally, the first portion comprises an open-curved wall and a plurality of elements extending inwards from the open-curved wall. Furthermore, at least one of the plurality of elements extends outwards from the open-curved wall and connects the second portion of the tool to the open-curved wall. In such instance, at least one of plurality of elements extending outwards from the open-curved wall is connected to the inner wall of the second portion.

Optionally, the holder comprises a longitudinal portion and a rotatable portion attached to the longitudinal portion, the rotatable portion having a plurality of protruding elements, wherein the tool has a plurality of holes or depressions, and wherein the plurality of protruding elements of the rotatable portion are to be received in respective holes or depressions of the tool, when the tool is attached to the holder. Herein, the longitudinal portion functions as an extension arm that enables the user installing the measurement coil to hold the holder at a proximal end. The longitudinal portion typically has a length sufficient to keep the user at a safe distance from the conductor. The longitudinal portion has the rotatable portion attached at distal end thereof. The plurality of holes or depression structurally complement the plurality of protruding elements. Therefore, when the tool is attached to the holder the plurality of protruding elements of the rotatable portion fit in respective holes or depressions of the tool. It will be appreciated that the plurality of holes or depressions of the tool are sufficiently large in size to allow easy receiving of the plurality of protruding elements therein during attachment and easy removal of the plurality of protruding elements therefrom during detachment, once the tool is installed onto the conductor. Notably, a small pressure or force may be applied by the user performing the installation to detach the plurality of protruding elements from respective holes or depressions of the tool. Furthermore, the rotatable portion maneuvering of the holder and the tool attached thereto for an installation of the tool at the desired location on the conductor.

In an embodiment, the holder further comprises a sliding element arranged on the longitudinal portion of the holder. In an example, the measurement coil held by the second portion of the tool is U-shaped open loop structure having distinctive beginning and end points. Once the tool is installed onto the conductor, the sliding element pushes the beginning point of the measurement coil to connect with the end point of the measurement coil, resulting in a closed-loop measurement coil encircling the conductor. Optionally, interlocking mechanisms are provided on the beginning and end points of the measurement loop to ensure a secure connection therebetween. The lateral movement of the sliding element locks the beginning point and the end point of the measurement coil.

Optionally, the measurement coil and the tool are integrated into a single unit. Herein, the measurement coil is integrated with the tool, thereby simplifying construction of the tool. Specifically, integrating the measurement coil and the tool into a single unit eliminates requirement of additional components that allow snap fitting of the measurement coil onto the tool. Beneficially, the integration provides a higher stability and securely attaches the measurement coil to the tool.

Optionally, the measurement coil is a Rogowski coil. The Rogowski coil is an electrical sensor for measuring alternating current (AC) or high-speed current pulses in a conductor. The Rogowski coil is a helical coil of wire with the lead from one end returning through the centre of the coil to the other end, in a manner that both terminals are at the same end of the coil. The Rogowski coil is installed around the conductor whose current is to be measured. Typically, the voltage induced in the Rogowski coil is proportional to the rate of change of current in the conductor. The Rogowski coil is connected to an electronic integrator circuit to provide an output signal that is proportional to the current. In an example, the electronic integrator may be a single-chip signal processor with built-in analogue to digital converters. Notably, separate Rogowski coils may be used for separate conductors in an electrical arrangement. Beneficially, the apparatus of the present disclosure enables installation of separate Rogowski coils for each of the phases, thereby minimizing tolerance difference therebetween. Additionally, the Rogowski coil does not possess a magnetic (iron) core, therefore, there is no saturation or non-linear effects associated with the magnitude of the current thus ensuring excellent linearity in current measurement.

Optionally, the measurement coil of the present disclosure has a customized winding density and coil cross sectional area that has reduced variation in the measurement accuracy depending on the position of the current in the measurement coil and also the size of the current conductor relative to the measurement coil. It will be appreciated the variation of measurement accuracy improves as the diameter of the conductor increases relative to the cross-sectional area of the measurement coil. Moreover, the positional variation significantly increases when the conductor is positioned in proximity of junction where the beginning and end points of the measurement coil lock together. Furthermore, wrapping the measurement coil twice around the conductor improves the positional variation but halves the current and doubles the coil sensitivity.

Optionally, the measurement coil comprises a cancellation loop which greatly reduces its susceptibility to external currents ensuring a minimised external pick-up variation. Beneficially, the measurement coils of the present disclosure are optimised to attenuate any voltage interference. The measurement coil of the present disclosure, preferably U-shaped measurement coils, are suitable to compensate for the effect of external voltages or currents by being arranged around the conductor (for measuring the desired current) but not looped around the conductor.

DETAILED DESCRIPTION OF THE DRAWINGS

Referring to FIG. 1A, there is shown a perspective view of an apparatus 100 in accordance with an embodiment of the present disclosure. The apparatus 100 comprises a tool 102 and a holder 104. The holder 104 is configured to be detachably attached to the tool 102 and is employed to install the tool 102 holding a measurement coil 110 onto a conductor (not shown). The tool 102 comprises a first portion 106 and a second portion 108 at least partially surrounding the first portion 106. The second portion is configured to hold a measurement coil 110. The first portion 106 is configured to receive the conductor and snap fit onto the conductor during installation so that the measurement coil 110 at least partially surrounds the conductor when installed.

The first portion 106 is shown to comprise an open-curved wall 112 and a plurality of elements, such as the elements 114 and 116, extending inwards from the open-curved wall 112. Notably, at least one of the plurality of elements, such as the element 114, extends outwards and is connected to the second portion 108 of the tool 102. The second portion 108 is shown to comprise an inner wall 118, an outer wall 119 and a base 117. The outer wall 119 comprises fingers, such as fingers 120 and 122 extending laterally from the base 117. The measurement coil 110 is bent into a curved shape when held by the second portion 108 of the tool 102. The measurement coil 106 is connected further to an external circuit (not shown) to provide an output signal using the cable 124. The holder 104 comprises a longitudinal portion 126 and a rotatable portion 128 attached to the longitudinal portion 126. The rotatable portion 128 has a plurality of protruding elements, such as the protruding elements 130 and 132, and the tool 102 has a plurality of holes, such as the holes 134 and 136. The plurality of protruding elements 130 and 132 of the rotatable portion 128 are to be received in respective holes 134 and 136 the tool 102, when the tool 102 is attached to the holder 104.

Figure 1B:
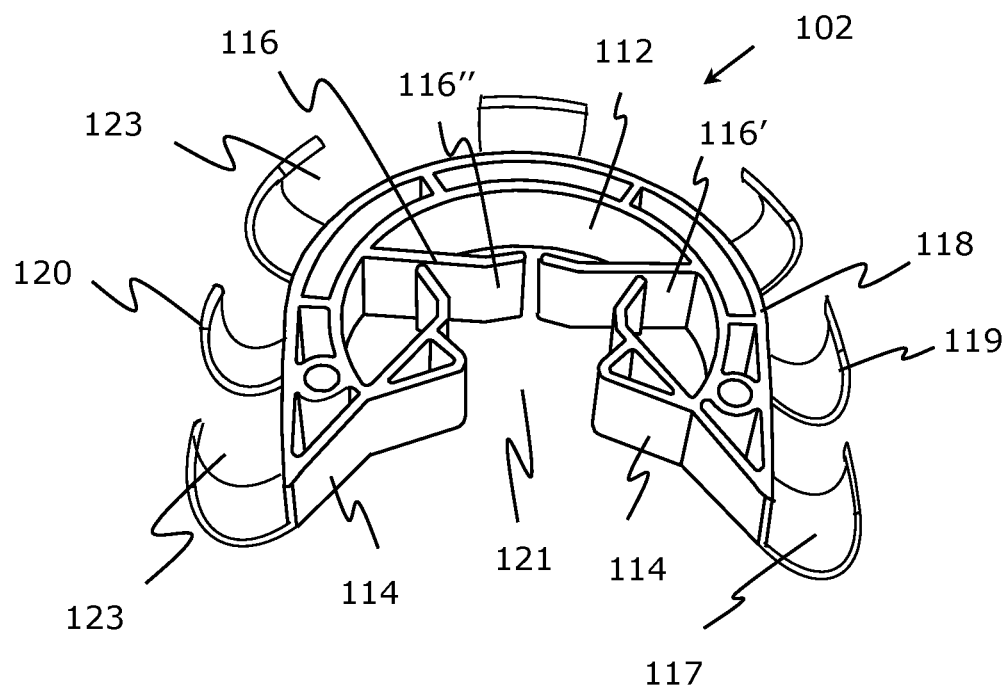
FIG. 1B is a perspective view of a tool shown in FIG. 1A.

Referring to FIG. 1B, there is illustrated a perspective view of a tool 102 shown in FIG. 1A. The tool 102 has a curved shape implemented as a U-shape. The tool 102 is designed for an elongate substantially conical measurement coil, as shown in FIG. 1A, and is formed of a first portion and a second portion, both portions being made of flexible material, such as a polymer. In the first portion, there is a grid-like structure formed of a plurality of interconnected different-length elements 114, 116, such as polymer ribbons or polymer sheets, which define a space 121 in the centre portion of the tool 102. On the sides of the space 121, there is provided a first pair of elements 114 arranged opposite to each other at a first distance from said space 121, and between the elements 114 at a second distance from said space 121, a second pair of elements 116 having their first ends 116' connected to an open-curved wall 112, and their second ends 116" unconnected.

In the second portion, alongside the first portion, the tool 102 is provided with a plurality of fingers 120, each of which fingers being bendable laterally with respect to the space 121. The fingers 120 are spaced apart and arranged around the curved shape of the tool 102 so that the distance of each finger to said space 121 is substantially the same when the tool 102 is bent into a circular shape. In FIG. 1B, there are three fingers on the left, three fingers on the right and one finger therebetween.

Each of the fingers 120 is designed to be curved, such as C-shaped, to conform to the curved shape of the outer circumference of the measurement coil. The fingers 120 are dimensioned so that the diameter of the inner circumference of the finger is equal to or larger than the diameter of the measurement coil to be installed thereon. For each finger 120, on the same side of the tool 102, there is further an aperture 123 through which the measurement coil may be installed or removed when needed. The apertures 123 are dimensioned so that at rest, when the finger is not bent laterally, the aperture is smaller than the diameter of the measurement coil but when the finger is bent from its rest position laterally, the size of aperture may be larger. The fingers must therefore be bent to install or remove the measurement coil.

When installing the measurement coil onto the tool 102, the measurement coil is placed above the apertures 123 of the second portion, parallel to them. Each part of the measurement coil is then compressed against each corresponding aperture 123, whereby the finger 120 is bent when compressed. When the force increases sufficiently because of compression, the size of the aperture 123 relative to its rest position increases laterally due to the bending of the finger. When the size of the aperture 123 becomes equal to the diameter of the measurement coil, the measurement coil protrudes through the aperture and abuts against the base 117. At the same time, the size of the aperture decreases when the finger 120 returns to its rest position.

Figure 2:
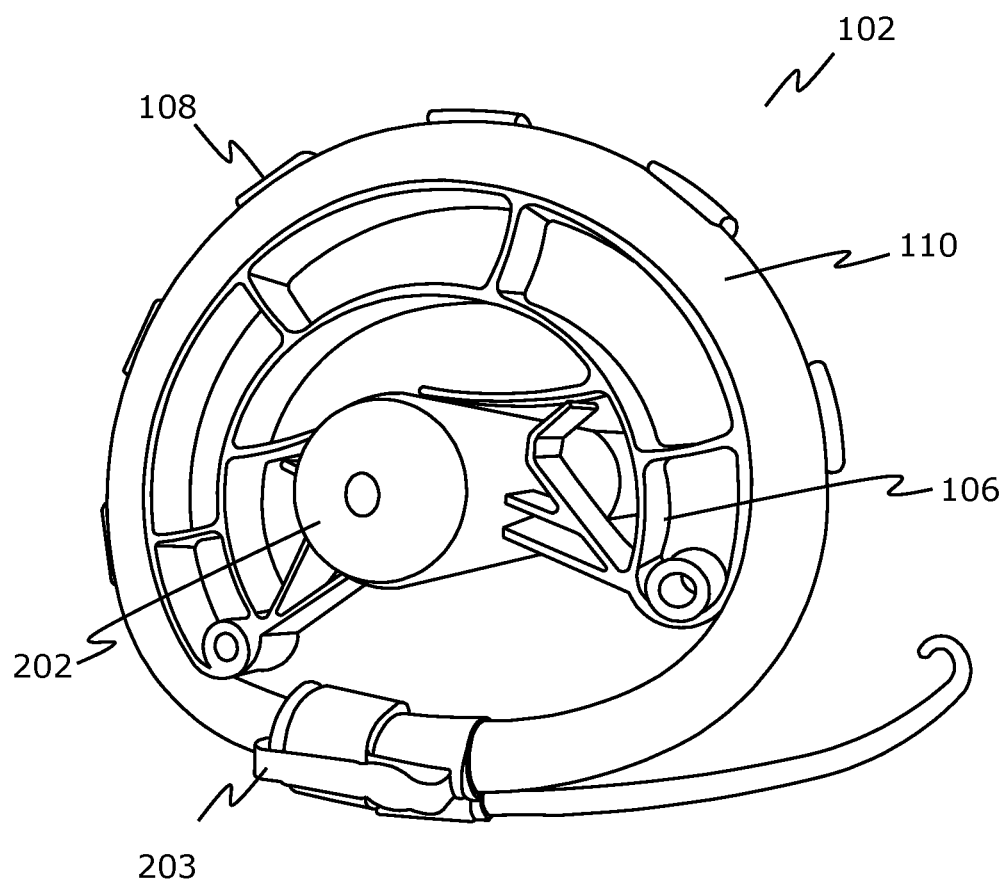
FIG. 2 is a perspective view of the tool holding the measurement coil installed onto a conductor, in accordance with an embodiment of the present disclosure.

Referring to FIG. 2, there is shown a perspective view of the tool 102 holding the measurement coil 110 installed onto a conductor 202, in accordance with an embodiment of the present disclosure. As shown, the tool 102 comprises a first portion 106 and a second portion 108 at least partially surrounding the first portion 106. As shown, the first portion 106 has been snap fitted, i.e., interlocked, by means of a cantilever 203 onto the conductor 202 during installation. When installed the mating parts of the measurement coil are pushed together whereby the parts interlock together. When interlocked, the measurement coil 110 surrounds the conductor 202. In the FIG. 2 the measurement coil 110 is arranged as O-shaped form. Other exemplary ways of installing the measurement coil around the conductor are shown in FIGS. 5A, 5B, 5C, and 5D.

Figure 3:
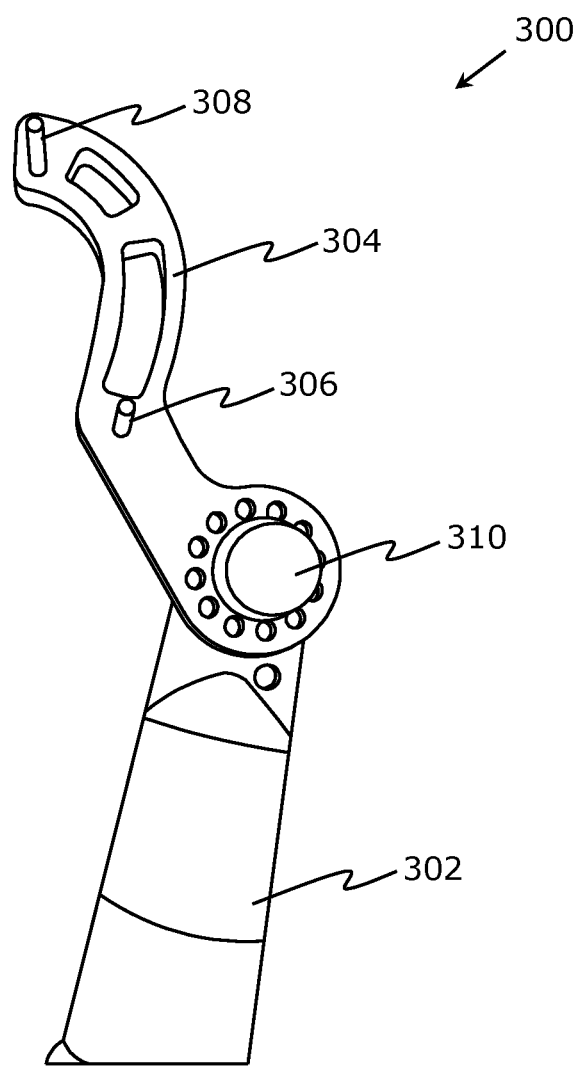
FIG. 3 is a perspective view of a holder, in accordance with another embodiment of the present disclosure.

Referring to FIG. 3, there is shown a perspective view of a holder 300, in accordance with another embodiment of the present disclosure. The holder 300 comprises a longitudinal portion 302 and a rotatable portion 304 attached to the longitudinal portion 302. The rotatable portion 304 has a plurality of protruding elements, such as the protruding elements 306 and 308. As shown, the rotatable portion 304 has a sickle shape. The rotatable portion 304 is attached to the longitudinal portion 302 via a rotatable hinge 310, that allows rotation of the rotatable portion 304 thereabout. In addition to rotation an angle between the rotatable portion 304 and the longitudinal portion 302 can be adjusted. In such embodiment the rotatable hinge 310 can be in addition to rotation tilted.

Figure 4A:
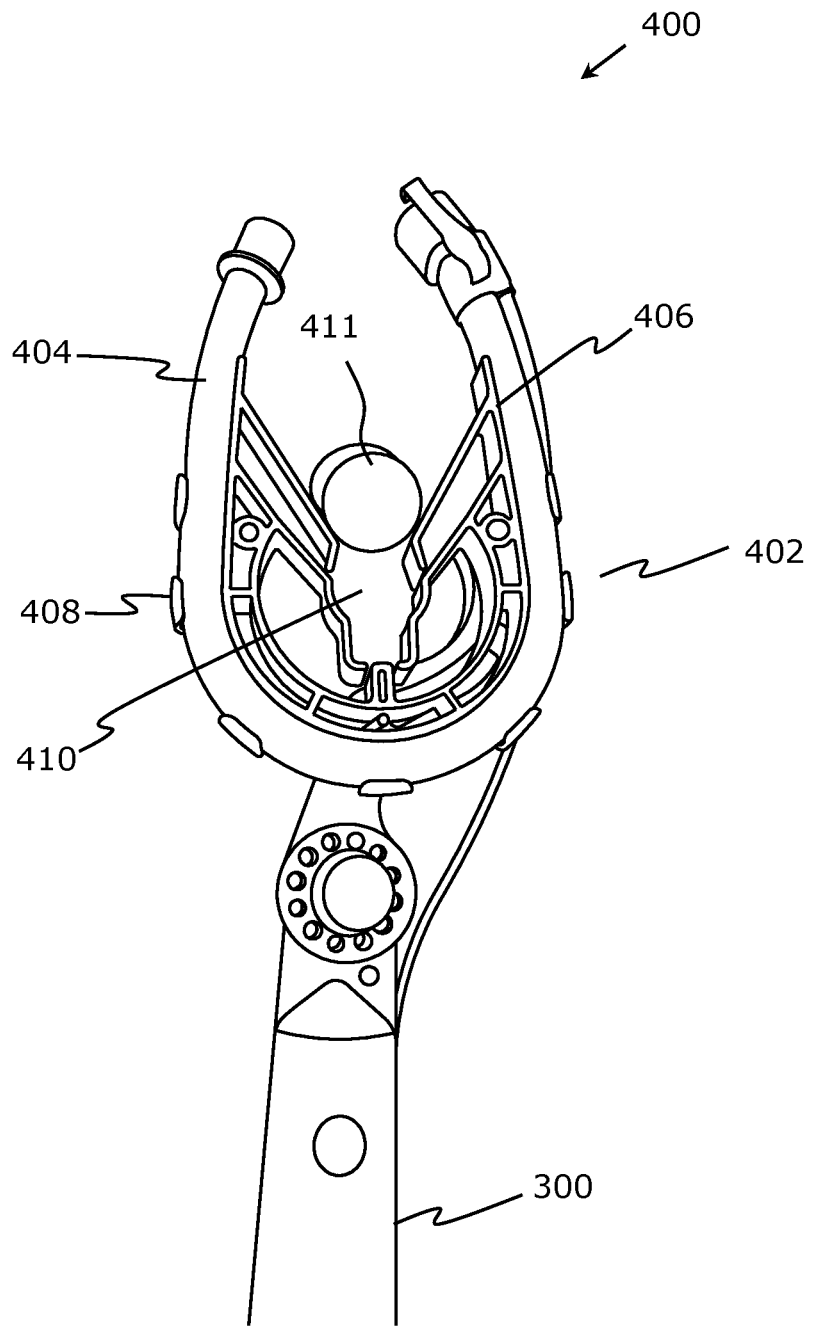
FIG. 4A is a perspective view of an apparatus comprising a holder attached to a tool, in accordance with an embodiment of the present disclosure.

Referring to FIG. 4A, there is shown a perspective view of an apparatus 400 comprising a holder 300 attached to a tool 402, in accordance with an embodiment of the present disclosure. The holder 300 (as shown in FIG. 3) is detachably attached to the tool 402 and employed to install the tool 402 holding a measurement coil 404 onto a conductor. The tool 402 comprises a first portion 406 and a second portion 408 at least partially surrounding the first portion 406. As shown, the second portion 408 has a curved shape implemented as a U-shape. The measurement coil 404 is bent into the curved shape when held by the second portion 408 of the tool 402. As a result, the curved shape of the measurement coil 404 is a U-shape. During installation, the conductor is snap fitted into the space 410 formed by the first portion 406 proximate to the centre of the curved shape of the measurement coil 404.

Figure 4B:
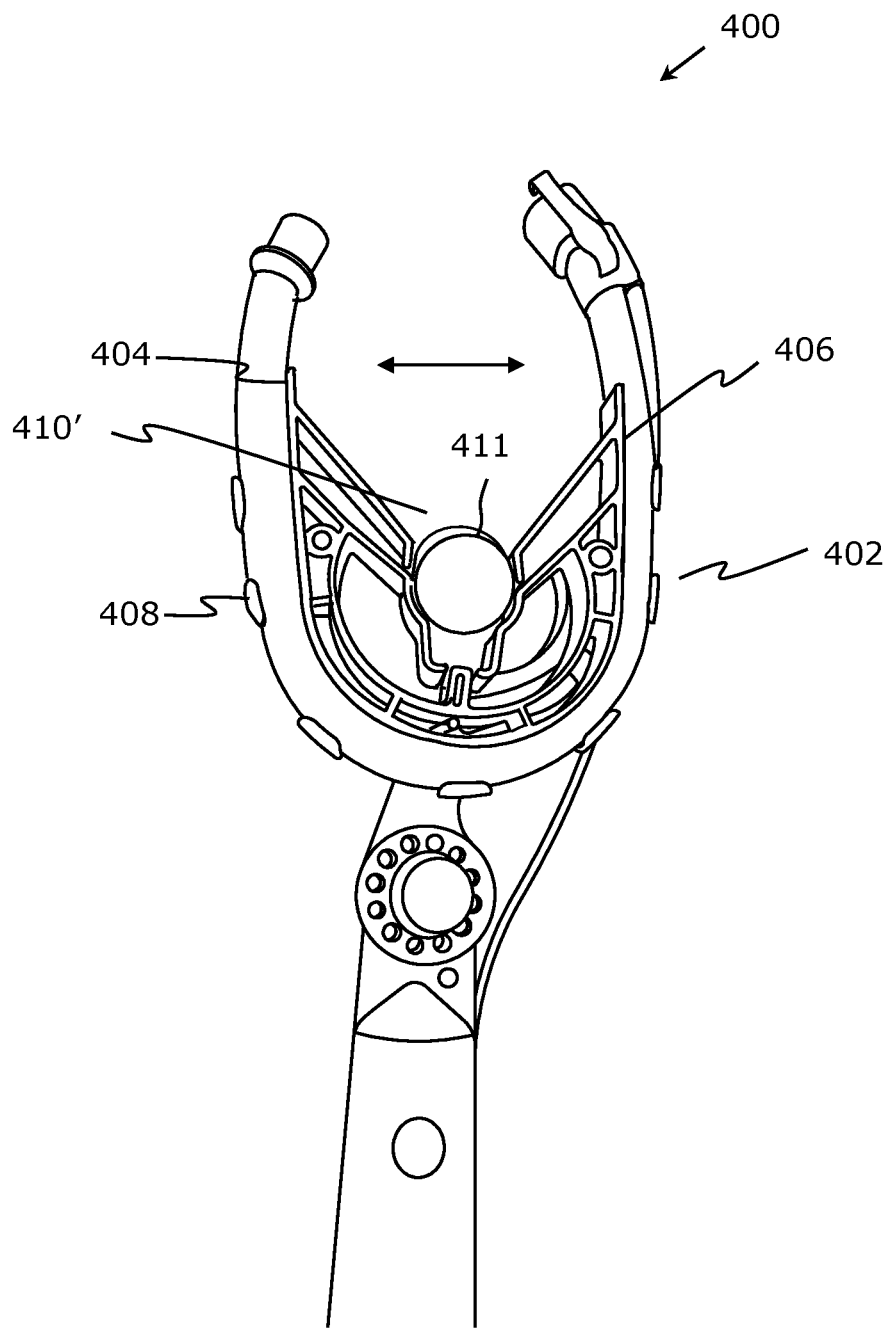
FIG. 4B is a perspective view of installation of an apparatus shown in FIG. 4A.

Referring to FIG. 4B, there is shown a perspective view of an apparatus shown in FIG. 4A during the installation of a conductor 411. When installing the conductor in the apparatus 400, the measurement coil 404 is initially open, for example U-shaped, as shown in FIG. 4B. When the measurement coil 404 is open, the apparatus 400 is pushed toward the conductor 411 to install it for a measurement. When the apparatus receives the conductor, and the elements in the first portion are placed against the conductor, the conductor is guided along them towards the space 410 in the centre of the tool. When the conductor 411 is opposite the space 410 it protrudes against an aperture 410' which aperture initially, at rest, is smaller in width than the diameter of the conductor. Thus, when the conductor is against the aperture 410', and pushing the apparatus 400 further against the conductor 411 is continued, this applies the pushing force at the aperture of the space 410. As the pushing force increases large enough, the apparatus 400 begins to bend and widen laterally so that the elements in the first portion on opposite sides of the conductor move farther apart. Eventually when there is a sufficient pushing force exposed to the aperture, and the elements are moved far enough apart, the aperture 410' of the space reaches the diameter of the conductor. When the aperture 410' in front of the space and the diameter of the conductor are equal, the conductor 411 thus protrudes into the space. The elements abut the conductor and compress the conductor so that it remains in place in the space 410. In addition, the elements position the conductor circumferentially so that the conductor is substantially equidistant from the measurement coil when the measurement coil is closed, as shown, for example, in FIG. 2. The bending of the tool in the lateral directions, during conductor installation, is shown in FIG. 4B by the two-way arrows. Once the apparatus has been installed as described above, it is possible to remove the holder by pulling the holder away from the tool, thereby releasing the protruding elements from the holes or depressions, or other attaching means provided therein.

The apparatus makes it possible, not only to push, but also to pull the conductor with a tool when installed. When changing from pushing mode to pulling mode, the tool is rotated in the holder, for example 180 degrees, relative to the holder.

Referring to FIGS. 5A, 5B, 5C, and 5D, illustrated a perspective view of an apparatus of installation of a measurement coil 502 around a conductor 504, in accordance with various embodiments of the present disclosure. These top views illustrate horizontal setups of the installations.

Figure 5A:
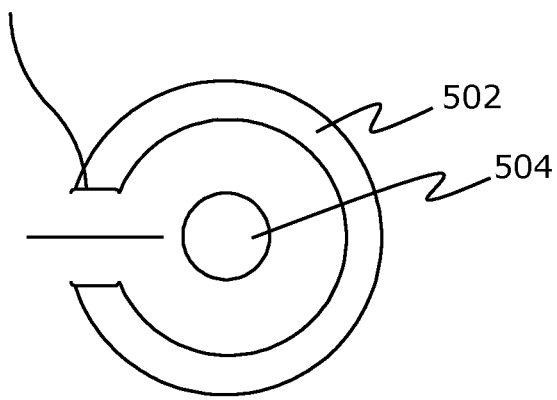
FIGS. 5A, 5B, 5C, and 5D are top views of installations of a measurement coil around a conductor, in accordance with various embodiments of the present disclosure.

In FIG. 5A, the measurement coil 502 is bent into a circular shape around the conductor 504 in a manner that the measurement coil 502 fully surrounds the conductor 504. The conductor 504 is located in a proximity of a centre of the circular shape and is not in contact with the measurement coil 502. This installation is an optimal installation of the measurement coil 502 around the conductor 504.

Figure 5B:
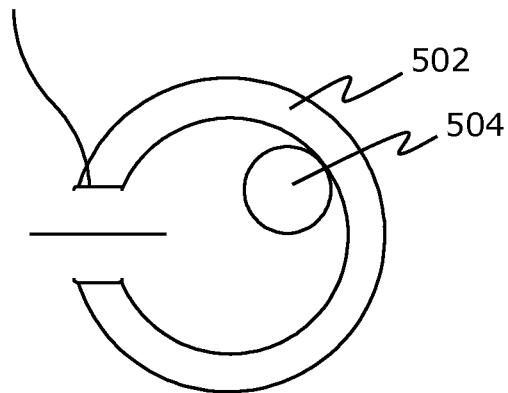

In FIG. 5B, the measurement coil 502 is bent into a circular shape around the conductor 504 in a manner that the measurement coil 502 fully surrounds the conductor 504. The conductor 504 is located in proximity of a periphery of the circular shape and is in contact with the measurement coil 502. Such installation is similar to a traditional installation of the measurement coil 502 around the conductor 504 that does not employ the apparatus (such as the apparatus 100 of FIG. 1) or the tool (such as the tool 102 of FIG. 1) for installation.

Figure 5C:
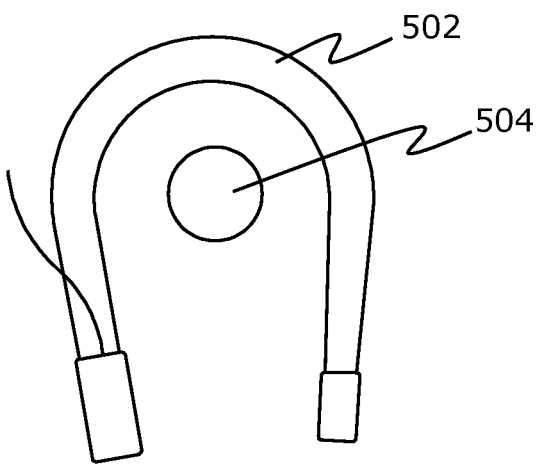

In FIG. 5C, the measurement coil 502 is bent into a U-shape around the conductor 504 in a manner that the measurement coil 502 partially surrounds the conductor 504. The conductor 504 is located in a proximity of a centre of the U-shape and is not in contact with the measurement coil 502. This installation is an optimal installation of the measurement coil 502 around the conductor 504.

Figure 5D:
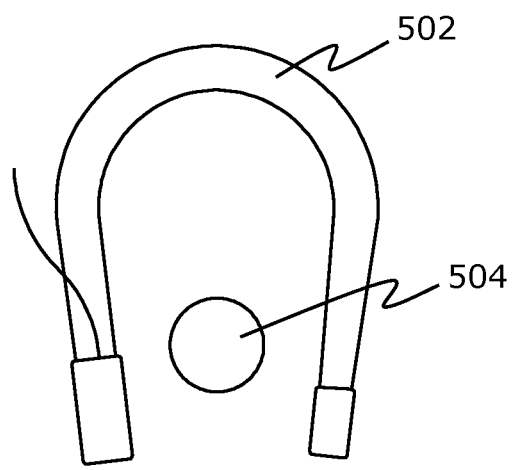

In FIG. 5D, the measurement coil 502 is bent into a U-shape around the conductor 504 in a manner that the measurement coil 502 partially surrounds the conductor 504. The conductor 504 is located in a periphery of the U-shape. Such off-centred positioning of the conductor 504 in a U-shaped measurement coil does not provide accurate measurement outputs and thus, is not suitable.

Referring to FIGS. 6A, 6B, 6C, and 6D, illustrated are side views of installations of the measurement coil 502 around a conductor 504, in accordance with various embodiments of the present disclosure. These side views illustrate vertical setups of the installations. The FIGS. 6A, 6B, 6C, and 6D correspond to the FIGS. 5A, 5B, 5C, and 5D, respectively.

Figure 6A:
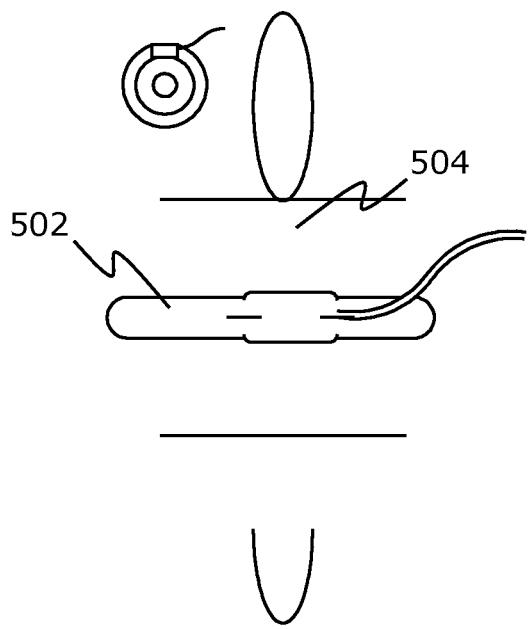
FIGS. 6A, 6B, 6C, and 6D are side views of installations of the measurement coil around a conductor, in accordance with various embodiments of the present disclosure.

In FIG. 6A, the measurement coil 502 is bent into a circular shape around the conductor 504. The conductor 504 is located in a proximity of a centre of the circular shape, and the conductor 504 is perpendicular to a plane of the circular shape. This installation is an optimal installation of the measurement coil 502 around the conductor 504.

Figure 6B:
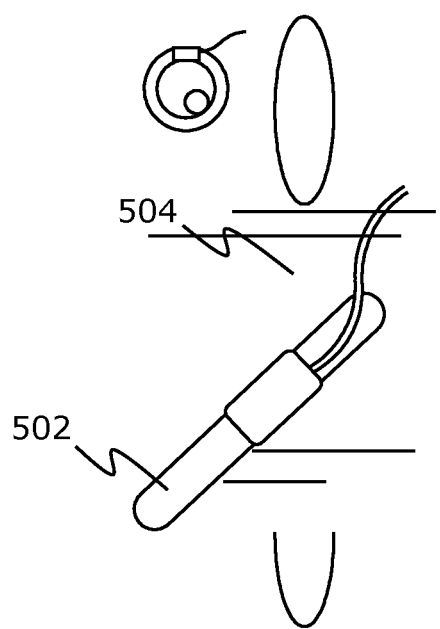

In FIG. 6B, the measurement coil 502 is bent into a circular shape around the conductor 504. The conductor 504 is located in proximity of a periphery of the circular shape, and the conductor 504 is not perpendicular to a plane of the circular shape. Notably, the conductor 504 is arranged obliquely (namely, at an angle) to the plane of the circular shape. Such installation is similar to a traditional installation of the measurement coil 502 around the conductor 504 that does not employ the apparatus (such as the apparatus 100 of FIG. 1) or the tool (such as the tool 102 of FIG. 1) for installation.

Figure 6C:
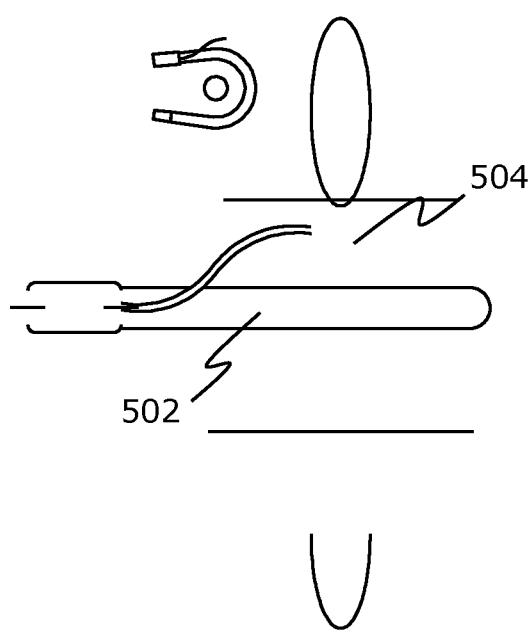

In FIG. 6C, the measurement coil 502 is bent into a U-shape around the conductor 504. The conductor 504 is located in a proximity of a centre of the U-shape, and the conductor 504 is perpendicular to a plane of the U-shape. This installation is an optimal installation of the measurement coil 502 around the conductor 504.

Figure 6D:
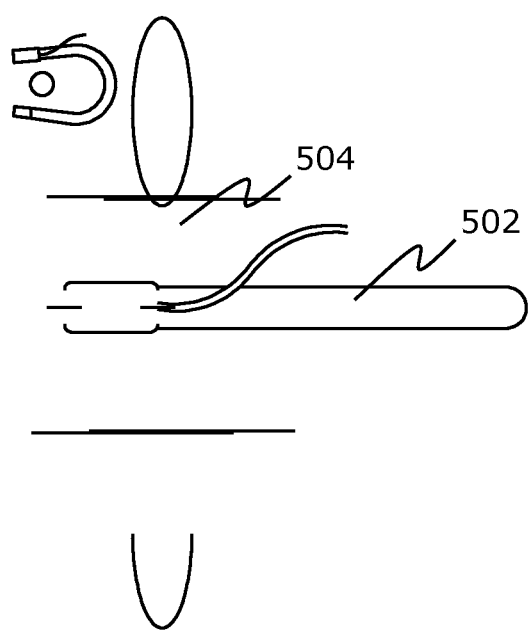

In FIG. 6D, the measurement coil 502 is bent into a U-shape around the conductor 504. The conductor 504 is located in a periphery of the U-shape, and the conductor 504 is perpendicular to a plane of the U-shape. Such off-centred positioning of the conductor 504 in a U-shaped measurement coil does not provide accurate measurement outputs and thus, is not suitable.

Figure 7:
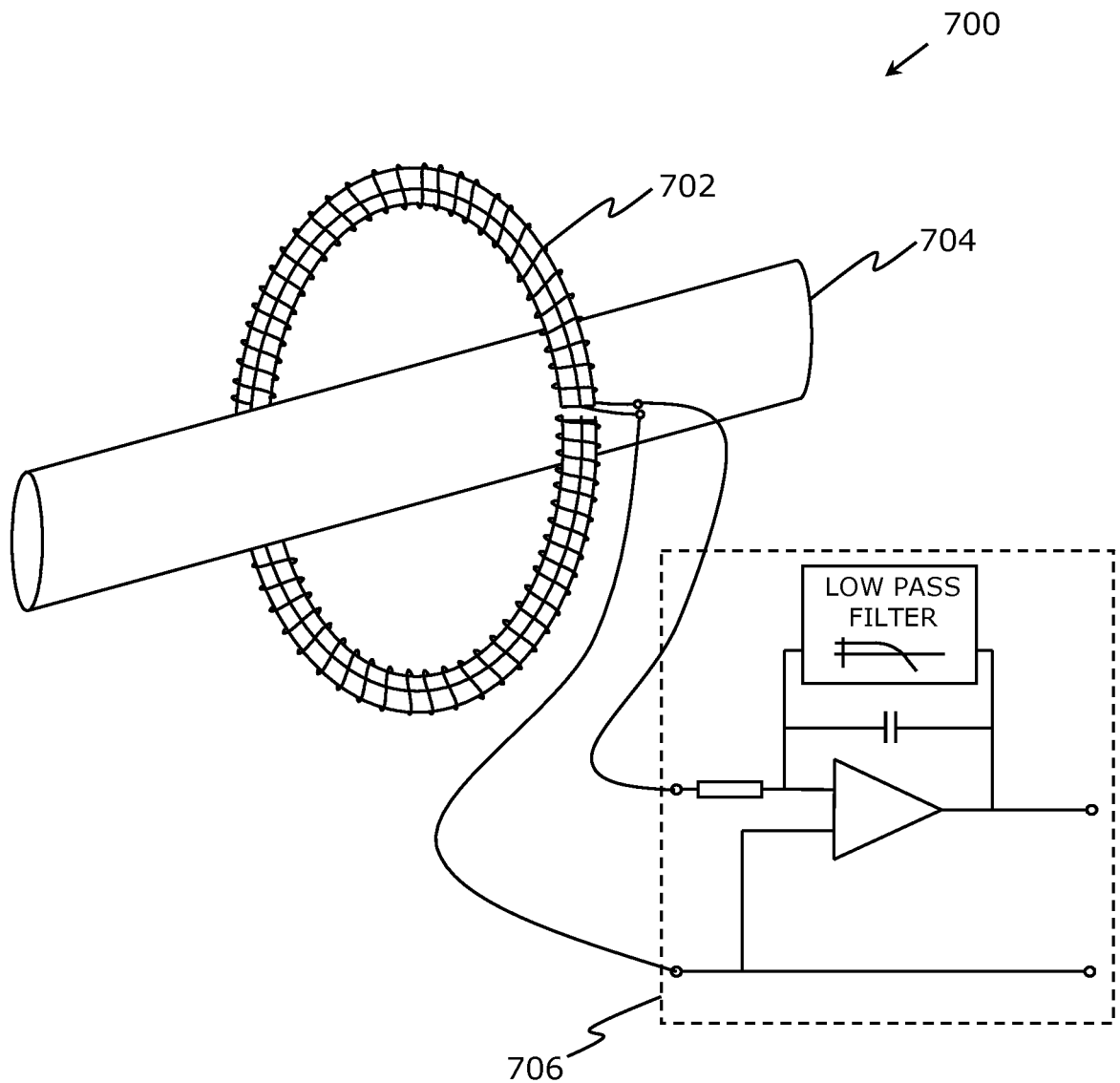
FIG. 7 is an electrical circuit configuration comprising a measurement coil implemented as a Rogowski coil, in accordance with an exemplary implementation of the present disclosure.

Referring to FIG. 7, there is shown an electrical circuit configuration 700 comprising a measurement coil implemented as a Rogowski coil 702, in accordance with an exemplary implementation of the present disclosure. The Rogowski coil 702 measures an alternating current flowing in a conductor 704. Notably, a voltage induced in a Rogowski coil 702 that is proportional to the rate of change of current in the conductor 704. The Rogowski coil 702 is connected an external integrator circuit 706 to generate an output signal that is proportional to the induced voltage and thus, proportional to measured alternating current. Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. An apparatus comprising:
   a tool comprising a first portion and a second portion at least partially surrounding the first portion, wherein the first portion is configured to receive a conductor and the second portion is configured to hold a measurement coil; and
   a holder configured to be detachably attached to the tool, wherein the holder is to be employed to install the tool holding the measurement coil onto a conductor,
   wherein the first portion is configured to snap fit onto the conductor during installation, and the measurement coil at least partially surrounds the conductor when installed,
   wherein the first portion and the second portion form a one-piece structure of flexible material;
   the first portion is formed of an open-curved wall and a plurality of interconnected elements configured to extend inwards from the open-curved wall towards a centre portion of the tool to apply a force onto the conductor, when installed, and accommodate the conductor in the centre portion thereof, and
   the second portion is formed of a plurality of fingers spaced apart, extending outwardly from the first portion, each finger having an inner wall connected to the first portion, an outer wall in parallel with the inner wall and a laterally extending base, defining a recess therebetween, and an aperture opposite the base to allow snap-fitting of the measurement coil into said recess to hold the measurement coil when installed.

2. The apparatus according to claim 1, wherein the measurement coil is bent into a curved shape when held by the second portion of the tool.

3. The apparatus according to claim 1, wherein the measurement coil is implemented on a printed circuit board, wherein the printed circuit board has a form factor of a curved shape arranged to be held by the second portion of the tool.

4. The apparatus according to claim 2, wherein the conductor is located in a proximity of a centre of the curved shape, and the conductor is perpendicular to a plane of the curved shape.

5. The apparatus according to claim 2, wherein the curved shape is circular.

6. The apparatus according to claim 2, wherein the curved shape is U-shaped.

7. The apparatus according to claim 2, wherein said elements are configured to hold the conductor in place in the centre portion of the tool.

8. The apparatus according to claim 1, wherein at least one of the plurality of elements extends outwards and is connected to the second portion of the tool.

9. The apparatus according to claim 1, wherein said fingers are configured to bend laterally.

10. The apparatus according to claim 1, wherein the measurement coil and the tool are integrated into a single unit.

11. The apparatus according to claim 1, wherein the holder comprises a longitudinal portion and a rotatable portion attached to the longitudinal portion, the rotatable portion having a plurality of protruding elements, wherein the tool has a plurality of holes or depressions, and wherein the plurality of protruding elements of the rotatable portion are to be received in respective holes or depressions of the tool, when the tool is attached to the holder.

12. The apparatus according to claim 1, wherein the measurement coil is a Rogowski coil.

13. A tool comprising a first portion and a second portion at least partially surrounding the first portion, wherein the first portion is configured to receive a conductor and the second portion is configured to hold a measurement coil, wherein the first portion is configured to snap fit onto a conductor during installation of the tool holding the measurement coil, and the measurement coil at least partially surrounds the conductor when installed,
   wherein the first portion and the second portion form a one-piece structure of flexible material;
   the first portion is formed of an open-curved wall and a plurality of interconnected elements configured to extend inwards from the open-curved wall towards a centre portion of the tool to apply a force onto the conductor, when installed, and accommodate the conductor in the centre portion thereof, and
   the second portion is formed of a plurality of fingers spaced apart, extending outwardly from the first portion, each finger having an inner wall connected to the first portion, an outer wall in parallel with the inner wall and a laterally extending base, defining a recess therebetween, and an aperture opposite the base to allow snap-fitting of the measurement coil into said recess to hold the measurement coil when installed.

14. The tool according to claim 13, wherein the measurement coil is bent into a curved shape when held by the second portion of the tool.

15. The tool according to claim 14, wherein said elements are configured to hold the conductor in place in the centre portion of the tool.

16. The tool according to claim 13; wherein the measurement coil is implemented on a printed circuit board, wherein the printed circuit board has a form factor of a curved shape arranged to be held by the second portion of the tool.

17. The tool according to claim 13, wherein the conductor is located in a proximity of a centre of the curved shape, and the conductor is perpendicular to a plane of the curved shape.

18. The tool according to claim 13, wherein the curved shape is circular.

19. The tool according to claim 13, wherein the curved shape is U-shaped.

20. The tool according to claim 13, wherein at least one of the plurality of elements extends outwards and is connected to the second portion of the tool.

21. The tool according to claim 13, wherein the measurement coil and the tool are integrated into a single unit.

22. The tool according to claim 13, wherein the measurement coil is a Rogowski measurement coil.

23. A method for installing an apparatus according to claim 1 in a conductor, wherein the method comprises steps of:
- attaching a tool to a holder;
- installing an open measurement coil in the tool;
- pushing or pulling the tool towards the conductor to be measured using the holder attached to it;
- guiding the conductor by means of the tool towards the centre portion of the tool;
- applying a force to the conductor in such a way that the conductor snap fits in place in the centre portion of the tool, and
- when the conductor is in place in the centre portion, removing the holder from the tool in such a way that after removing the measurement coil remains open, and the tool holds the measurement coil in place in the centre portion.

24. A method for installing a tool according to claim 13 in a conductor, wherein the method comprises steps of:
- installing an open measurement coil in the tool;
- pushing or pulling the tool towards the conductor to be measured;
- guiding the conductor by means of the tool towards the centre portion of the tool;
- applying a force to the conductor in such a way that the conductor snap fits in place in the centre portion of the tool, and
- when the conductor is in place in the centre portion, the measurement coil remains open, and the tool holds the measurement coil in place in the centre portion.

* * * * *